United States Patent
Tracy

(10) Patent No.: US 8,616,042 B2
(45) Date of Patent: Dec. 31, 2013

(54) METHOD AND APPARATUS FOR CALIBRATING DISPENSED DEPOSITS

(75) Inventor: Robert W. Tracy, Haverhill, MA (US)

(73) Assignee: Illinois Tool Works Inc., Glenview, IL (US)

( * ) Notice: Subject to any disclaimer, the term of this patent is extended or adjusted under 35 U.S.C. 154(b) by 216 days.

(21) Appl. No.: 13/072,355

(22) Filed: Mar. 25, 2011

(65) Prior Publication Data
US 2012/0240658 A1    Sep. 27, 2012

(51) Int. Cl.
*G01F 25/00* (2006.01)
(52) U.S. Cl.
USPC .......................................................... 73/1.36
(58) Field of Classification Search
USPC ................... 73/1.36; 347/17; 141/1
See application file for complete search history.

(56) References Cited

U.S. PATENT DOCUMENTS

| | | | |
|---|---|---|---|
| 1,779,270 A * | 10/1930 | Davis ............................... | 73/248 |
| 5,022,556 A | 6/1991 | Dency et al. | |
| 6,814,810 B2 | 11/2004 | Prentice et al. | |
| 7,980,197 B2 | 7/2011 | Prentice et al. | |
| 2005/0001869 A1* | 1/2005 | Abernathy et al. ............. | 347/17 |
| 2008/0105703 A1 | 5/2008 | Prentice et al. | |
| 2008/0296311 A1 | 12/2008 | Read | |
| 2011/0048575 A1 | 3/2011 | Abernathy et al. | |

OTHER PUBLICATIONS

International Search Report for PCT/US2012/030486 mailed Jun. 22, 2012.

* cited by examiner

*Primary Examiner* — Leonard Chang
*Assistant Examiner* — Tamiko Bellamy
(74) *Attorney, Agent, or Firm* — Lando & Anastasi, LLP

(57) ABSTRACT

A method of calibrating a dispenser of the type having an actuator that is movable over a variable stroke distance includes dispensing a quantity of viscous material from the dispenser by moving the actuator over one of a plurality of stroke distances, weighing the quantity of viscous material, repeating the acts of dispensing and weighing for each of the plurality of stroke distances, and displaying the weight of each of the dispensed quantities to a user using a user interface device.

8 Claims, 9 Drawing Sheets

500

Target Weight
○ Total Weight  ⦿ [Shotsize]
  — 508      — 510
  Calculate ...

502 — Shotsize: [0] mg
504 — Tolerance: ± [0] %

Number or Samples: [1]

Weigh Per Head Every
[1] Times
[0] Boards
--- or every ---
[0] Minutes
whichever comes first Pre-Dispense Template
None Selected
[Select Dot ...] [Select Line ...]
[Remove]

☐ Global Correction Factor
☑ Purge Before Weigh
☐ Clean Needle before Weigh

Dwell time: [0] milliseconds

[< Back]  [Finish]  [Cancel]

FIG. 5

- The "SST Pump Characterization" feature assits in finding the optimal charge value for a desired shot size
- You need to:
- Select the pump(s) from the list below
  ○ Left  ○ Right  ● Both
- Supply the dispensse parameters Dot Size: [50]   Clean Needle Every: [10] steps
  Rpm: [50]   Min Charge: [1500] microns — 604
  Dwell: [1000] ms   Max Change: [2500] microns — 606
  Right UpDwell: [2] ms   Charge Step: [100] microns — 608
  Left UpDwell: [0] ms

- Characterization Results ( Charge VS Shot Size )

| Charge | Right mg/shot | Left mg/shot |
|---|---|---|
| 2500 | 0.7620 | |
| 2400 | 0.7560 | |
| 2300 | 0.7440 | |
| 2200 | 0.7440 | |
| 2100 | 0.7320 | |
| 2000 | 0.7240 | |
| 1900 | 0.7140 | |
| 1800 | 0.7040 | |
| 1700 | 0.6880 | |
| 1600 | 0.6780 | |
| 1500 | 0.6660 | |
| 1400 | 0.6520 | |
| 1300 | 0.6400 | |

610

- Press "Run" to start the characterization process or "Cancel" to stop the measurement

[Run]   [Cancel]

- Press "Calculate" to calculate the Charge for the given target shot size

Target Shot Size: [0.72] mg/shot   [Calculate] — 612
  Right Charge: [1960] microns — 616
  Left Charge: [    ] microns — 618
  614

- Press "Apply" to copy the selected charge(s) and UpDwell(s) to the Process Program. This becomes the global charge value.

[Apply] — 620

- Press "Finish" to save the characterization results to the pump otherwise press "Cancel"

[Finish]   [Cancel]

| Pump | Pump | Charge | Calibrate | Converge | Previous (mg) | Current (mg) | difference | Mg/Shot |
|---|---|---|---|---|---|---|---|---|
| ZHead - Right | Purge | 2000 | ☐ | ☑ | 0.000 | 0.000 | --- | --- |
| ZHead - Left | Purge | 1900 | ☐ | ☑ | 0.000 | 0.000 | --- | --- |

710 { (bracketing the two ZHead rows)

700

Tolerance Mg/Shot
[ 1 ]

[ Calibrate ]

[ Unlock Door ]

Tolerance
[ 0 ] %

[ Config ]

☐ Clean needle before calibrate

Dot Size [ 100 ]

RPM [ 50 ]

[ Apply to Process Program ]

Process Program Pump Tolerance
0.00%

[ Finish ]   [ Cancel ]

FIG. 7

METHOD AND APPARATUS FOR CALIBRATING DISPENSED DEPOSITS

BACKGROUND OF THE INVENTION

1. Field of the Disclosure

This disclosure relates generally to methods and apparatus for dispensing a viscous material on a substrate, such as a printed circuit board, and more particularly to a method and an apparatus for calibrating dispensing material on a substrate with enhanced efficiency.

2. Discussion of Related Art

There are several types of prior art dispensing systems used for dispensing precise amounts of liquid or paste for a variety of applications. One such application is the assembly of integrated circuit chips and other electronic components onto circuit board substrates. In this application, automated dispensing systems are used for dispensing very small amounts, or dots, of viscous material onto a circuit board. The viscous material may include liquid epoxy or solder paste, or some other related material.

In one system capable of dispensing dots of material, a dispenser unit comprises a housing having a chamber and a piston disposed in the chamber. The piston (also referred to herein as an actuator) is configured to move between a pre-dispense position and a dispense position within the chamber. A motor is coupled to the piston to drive the movement of the piston within the chamber. The dispenser unit further comprises a dispensing bore configured to receive the piston therein and a nozzle coupled to the housing. The nozzle has an orifice co-axial with the dispensing bore. A controller is coupled to the motor to control the operation of the motor and thus the movement of the piston. The dispenser is constructed such that a volume of viscous material dispensed through the dispensing bore is substantially equal to the volume of the piston entering the dispensing bore when moving the piston to the dispense position. One such system is disclosed in U.S. Patent Publication No. 2008/0105703, entitled "METHOD AND APPARATUS FOR DISPENSING A VISCOUS MATERIAL ON A SUBSTRATE," which is owned by Illinois Tool Works, Inc. of Glenview, Ill., the assignee of the present invention, and which is incorporated herein by reference in its entirety.

Additionally, the dispensing system may be calibrated for accurately controlling the rate and amount of viscous material that is dispensed from the dispenser unit. For example, a quantity of material may be dispensed and weighed to determine if the unit is dispensing the desired amount of material for a given configuration of the system.

BRIEF SUMMARY OF THE INVENTION

One aspect of the disclosure is directed to a dispensing apparatus for dispensing viscous material on an electronic substrate. According to one embodiment of the present disclosure, a method of calibrating a dispenser of the type having an actuator that is movable over a variable stroke distance includes dispensing a quantity of viscous material from the dispenser by moving the actuator over one of a plurality of stroke distances, weighing the quantity of viscous material, repeating the acts of dispensing and weighing for each of the plurality of stroke distances, and displaying the weight of each of the dispensed quantities to a user using a user interface device. In another embodiment, the quantity of viscous material that is dispensed from the dispenser may be substantially equal to the volume of viscous material displaced by the actuator moving over a respective one of the plurality of stroke distances. In another embodiment, the user interface device may include a display coupled to a dispenser controller.

In another embodiment, the method may further include an act of dispensing a desired quantity of viscous material by adjusting the stroke distance of the actuator according to a function that relates the weight of each of the dispensed quantities to a respective one of the plurality of stroke distances, such that the desired quantity of viscous material substantially has a desired weight. In yet another embodiment, the actuator may be a first actuator, the quantity of viscous material may be a first quantity of viscous material, and the dispenser may further include a second actuator that is movable over the variable stroke distance for dispensing a second quantity of viscous material. The method may further include acts of dispensing the second quantity of viscous material from the dispenser by moving the second actuator over one of the plurality of stroke distances, weighing the second quantity of viscous material, repeating the acts of dispensing the second quantity and weighing the second quantity for each of the plurality of stroke distances, and displaying the weight of each of the dispensed second quantities to the user using the user interface device.

In another embodiment, the function may be a first function and the desired quantity may be a first desired quantity. The method may further include an act of dispensing a second desired quantity of viscous material by adjusting the stroke distance of the second actuator according to a second function that relates the weight of each of the dispensed second quantities to a respective one of the plurality of stroke distances, such that the second desired quantity of viscous material substantially has the desired weight. In yet another embodiment, the method may further include an act of determining a stroke distance offset based on a difference between the adjusted stroke distance of the first actuator and the adjusted stroke distance of the second actuator. In yet another embodiment, the adjusted stroke distance of the second actuator may be the adjusted stroke distance of the first actuator modified by the stroke distance offset.

According to one embodiment of the present disclosure, a controller coupled to a dispenser of the type having an actuator that is movable over a variable stroke distance includes a calibration component configured to perform acts of dispensing a quantity of viscous material from the dispenser by moving the actuator over one of a plurality of stroke distances, weighing the quantity of viscous material, repeating the acts of dispensing and weighing for each of the plurality of stroke distances, and displaying the weight of each of the dispensed quantities to a user using a user interface device coupled to the controller. In another embodiment, the quantity of viscous material that is dispensed from the dispenser may be substantially equal to the volume of viscous material displaced by the actuator moving over a respective one of the plurality of stroke distances. In yet another embodiment, the user interface device may include a display.

In another embodiment, the controller may further include a dispensing component configured to perform an act of dispensing a desired quantity of viscous material by adjusting the stroke distance of the actuator according to a function that relates the weight of each of the dispensed quantities to a respective one of the plurality of stroke distances, such that the desired quantity of viscous material substantially has a desired weight.

In another embodiment, the actuator may be a first actuator, the quantity of viscous material may be a first quantity of viscous material, and the dispenser may further include a second actuator that is movable over the variable stroke distance for dispensing a second quantity of viscous material. The dispensing component may be further configured to perform acts of dispensing the second quantity of viscous material from the dispenser by moving the second actuator over one of the plurality of stroke distances, weighing the second quantity of viscous material, repeating the acts of dispensing the second quantity and weighing the second quantity for each of the plurality of stroke distances, and displaying the weight of each of the dispensed second quantities to the user using the user interface device.

In another embodiment, the function may be a first function and the desired quantity may be a first desired quantity. The dispensing component may be further configured to perform an act of dispensing a second desired quantity of viscous material by adjusting the stroke distance of the second actuator according to a second function that relates the weight of each of the dispensed second quantities to a respective one of the plurality of stroke distances, such that the second desired quantity of viscous material substantially has the desired weight. In yet another embodiment, the dispensing component may be further configured to perform an act of determining a stroke distance offset based on a difference between the adjusted stroke distance of the first actuator and the adjusted stroke distance of the second actuator. In yet another embodiment, the adjusted stroke distance of the second actuator may be the adjusted stroke distance of the first actuator modified by the stroke distance offset.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 5 is a screen shot showing a user interface in accordance with one embodiment of the present disclosure;

FIG. 6 is a screen shot showing a user interface in accordance with another embodiment of the present disclosure;

FIG. 7 is a screen shot showing a user interface in accordance with yet another embodiment of the present disclosure.

DETAILED DESCRIPTION OF THE INVENTION

Figure 1:
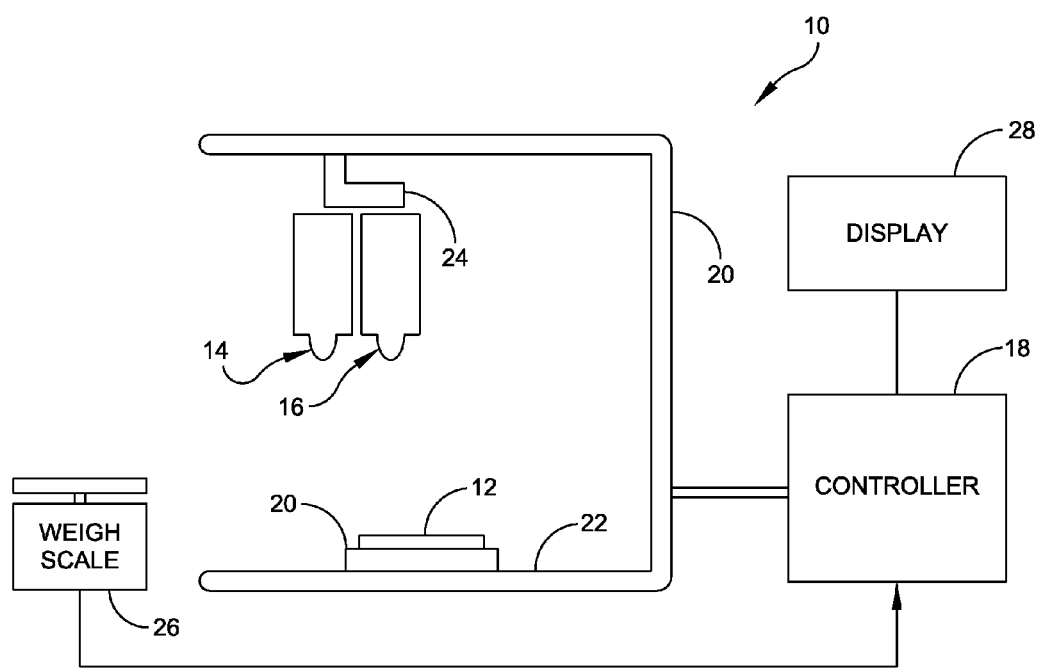
FIG. 1 is a side schematic view of a dispenser in accordance with one embodiment of the present disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways.

Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Various embodiments of the present disclosure are directed to viscous material dispensing systems, devices including dispensing systems, and methods of calibrating such systems.

FIG. 1 schematically illustrates a dispenser, generally indicated at 10, according to one embodiment of the present disclosure. The dispenser 10 is used to dispense a viscous material (e.g., an adhesive, encapsulent, epoxy, solder paste, underfill material, etc.) or a semi-viscous material (e.g., soldering flux, etc.) onto an electronic substrate 12, such as a printed circuit board or semiconductor wafer. The dispenser 10 may alternatively be used in other applications, such as for applying automotive gasketing material or in certain medical applications. It should be understood that references to viscous or semi-viscous materials, as used herein, are exemplary and intended to be non-limiting. The dispenser 10 includes first and second dispensing units or heads, generally indicated at 14 and 16, respectively, and a controller 18 to control the operation of the dispenser. Although two dispensing units are shown, it should be understood that one or more dispensing units may be provided. The dispenser 10 may also include a frame 20 having a base 22 for supporting the substrate 12, a gantry 24 movably coupled to the frame 20 for supporting and moving the dispensing units 14, 16, and a weight measurement device 26 for weighing dispensed quantities of the viscous material, for example, as part of a calibration procedure, and providing weight data to the controller 18. A conveyor system (not shown) or other transfer mechanism such as a walking beam may be used in the dispenser 10 to control loading and unloading of circuit boards to and from the dispenser. The gantry 24 can be moved using motors under the control of the controller 18 to position the dispensing units 14, 16 at predetermined locations over the circuit board. The dispenser 10 may optionally include a display unit 28 connected to the controller 18 for displaying various information to a user. There may be an optional second controller for controlling the dispensing units.

In one embodiment, the dispenser 10 is configured to dispense viscous material using a conventional "streaming" technique, wherein the dispenser launches discrete amounts, or shots, of the material toward the substrate at a controlled volumetric flow rate for each deposit. As will be described in further detail below with respect to FIGS. 2A and 2B, the dispenser 10 may be configured to dispense varying amounts of material in a controllable manner. It is appreciated that the amount of material dispensed in a given configuration of the dispenser 10 may vary with respect to the viscosity of the material being dispensed. For example, materials with a higher viscosity tend to be more resistive to flow than materials with lower viscosity, thus affecting the flow rate of the dispenser 10 in a given configuration and for a given material. Further, the viscosity of a particular material may vary over relatively short periods of time (e.g., hours) due to changes in the temperature or other properties of the material, or as a consequence of variations in composition (e.g., between different batches of the material), which further affects the flow rate and, accordingly, the quantity of material deposited per shot. Therefore, according to some aspects, the amount of material dispensed by the dispenser 10 in a given configuration can be determined as a function of the viscosity of the material at the time it is being dispensed. One exemplary function will be described below with respect to FIG. 3.

Since it can be important to carefully control the amount of material being dispensed, the dispenser 10 should be calibrated prior to, or during, use to ensure that the desired quantity of material will be dispensed in a predictable manner. According to one embodiment, information gathered during the calibration process may be used, on a periodic or continuous basis, to automatically adjust the dispenser 10 to maintain a desired volumetric flow in response to variations in the viscosity of the material.

Figure 2A:
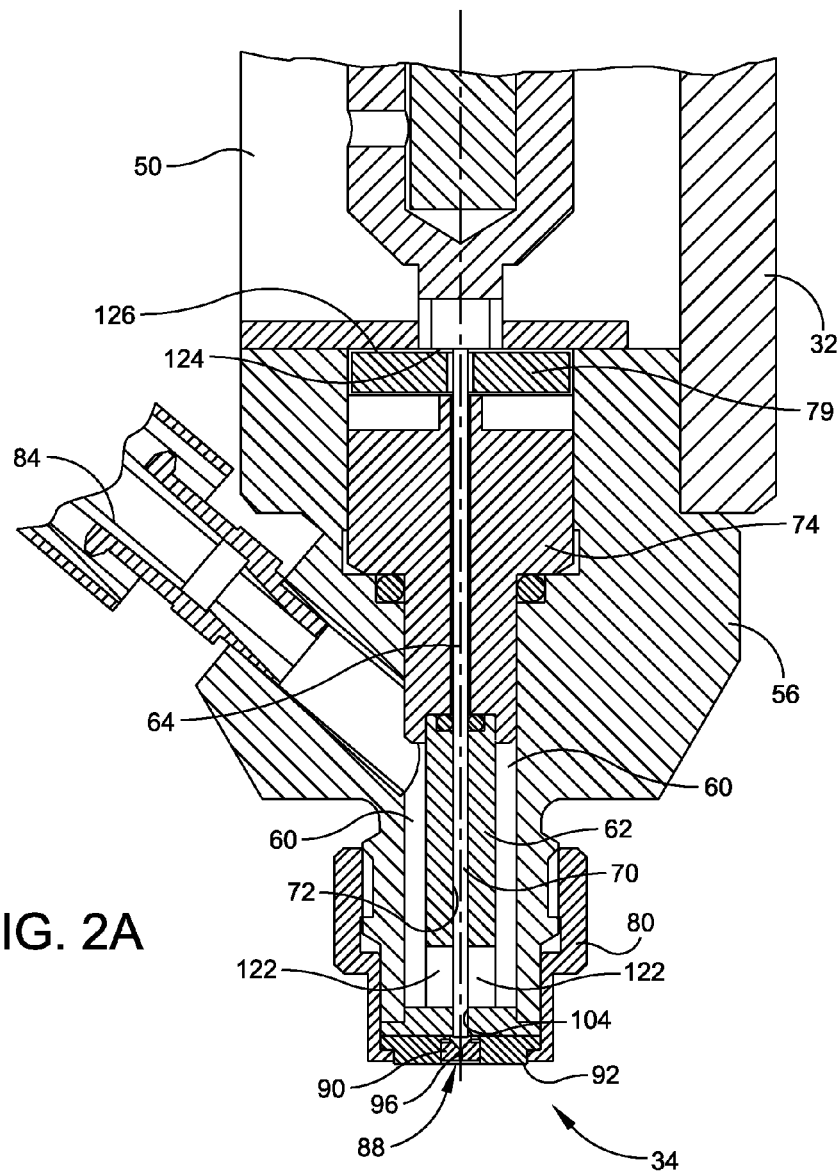
FIG. 2A is a cross-sectional view of a portion of the dispenser shown in FIG. 1.
Figure 2B:
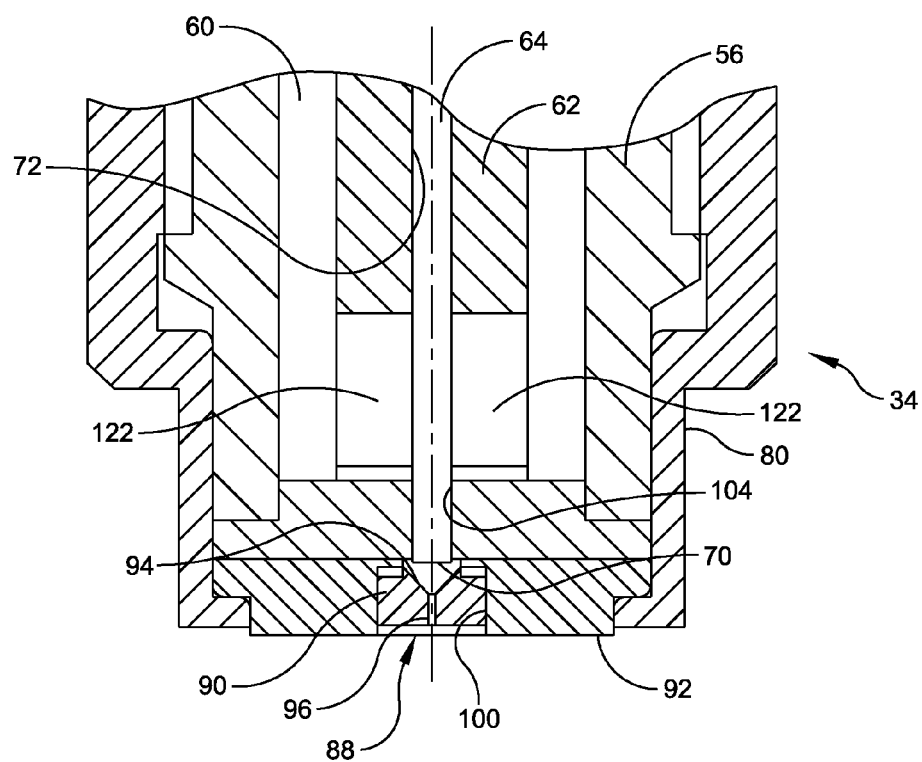
FIG. 2B is an enlarged cross-sectional view of a portion of the dispenser shown in FIG. 2A.

FIGS. 2A and 2B show schematic cross-sectional views of a portion of one of the dispensing heads 14 of the dispenser 10 shown in FIG. 1, according to one embodiment. Both dispensing heads 14 and 16 of FIG. 1 are similar or substantially identical to one another. The dispensing head 14 includes a dispenser housing 32 and a nozzle assembly generally indicated at 34. The nozzle assembly 34 may include a nozzle housing 56, which is secured to the dispenser housing 32 with a retaining screw (not shown). The nozzle housing 56 may be configured to include a cylindrical chamber 60 configured to receive a barrel cylinder 62 and a piston 64 having an upper end and a lower end having a flat surface 70. The piston 64 is configured to be received and slidably moved within an elongated bore 72 formed in the barrel cylinder 62 along a longitudinal axis. The elongated bore 72 of the barrel cylinder 62 is sized to receive the piston 64 therein so that the piston can slide within the bore.

The cylindrical chamber 60 defines a small dispensing cavity that is in fluid communication with a material feed tube 84, which is adapted to receive viscous material. The viscous material is delivered to the cylindrical chamber 60 to the small dispensing cavity under pressure. As best shown in FIG. 2B, the nozzle assembly 34 further includes an orifice assembly, generally indicated at 88, designed to be threadably secured to the lower end of the nozzle housing 56 by the needle nut 80. Specifically, the orifice assembly 88 comprises an orifice insert 90, an orifice adapter 92 configured to receive the orifice insert, and the needle nut 80, which is configured to threadably attach the entire orifice assembly to the nozzle housing 56 by the needle nut 80. As shown, the orifice insert 90 is a generally cylindrical member having a conical surface 94 and a small-diameter bore 96, e.g., 0.005 inches in diameter, formed therein.

Viscous material flows from the material feed tube 84 to the chamber 50 so that viscous material is deposited under pressure between an inner wall of the nozzle housing 56 that defines the cylindrical chamber 60 and an outer wall of the barrel cylinder 62. The material is supplied generally in continuous quantities so as not to starve the dispensing head 14 of material or introduce air into the chamber 50. Viscous material enters the dispensing bore 104 by way of two narrow slits, each indicated at 122, formed in the barrel cylinder 62. The arrangement is such that when the piston 64 is in a retracted position, viscous material enters the bore 72 formed in the barrel cylinder 62 and the dispensing bore 104. Thus, when the piston 64 is moved to an extended or dispensing position toward the orifice insert 90, the piston blocks the communication of viscous material between the narrow slits 122 and the dispensing bore 104 as material in the dispensing bore is dispensed. A sleeve (not shown) may be provided around the barrel cylinder 62 to selectively enlarge or reduce the size of the slits 122 to increase or decrease the amount of material entering the dispensing bore 104.

In the shown embodiment, the barrel cylinder 62, the piston 64 and the orifice insert 90 are removable and interchangeable so that the size of the dots of viscous material may be changed. For example, for larger dots, the size of the barrel cylinder 62, the piston 64, the small diameter bore 104, and dispensing bore 96 in the orifice insert 90 may be increased. Conversely, for smaller dots, these dimensions may be decreased. Further adjustments to the dispensed quantities of material may be accomplished by varying a stroke distance of the piston 64, as discussed in greater detail below.

When operating the dispenser 10, the piston 64 is moved between the retracted (or charge or pre-dispense) and extended (dispense) positions to dispense dots of material from the dispensing bore 104 of the orifice adapter 92 via the small diameter bore 96 of the orifice insert 90. Specifically, when the piston 64 is in its retracted position, viscous material enters the dispensing bore 104 from the cylindrical chamber 60 by way of slits 122. When moved to its extended position, the piston 64 cuts off the supply of viscous material to the dispensing bore 104 by blocking the slits 122 of the barrel cylinder 62. As discussed above, as the piston 64 enters the dispensing bore 104, the flat end 70 of the piston 64 shears trapped particles contained within the dispensing chamber within the dispensing bore 104. The arrangement is such that the volume of viscous material dispensed from the dispensing bore 104 is substantially equal to the volume of the piston entering the dispensing bore. Accordingly, the amount of material dispensed can be controlled by selecting a stroke distance of the piston 64, indicated at A. According to some embodiments, the stroke distance A is variable, for example, by the controller 18 of FIG. 1. The downward stroke of the piston 64 is limited by a shoulder portion or surface 124 of the head 106 of the piston that engages a shoulder portion or surface 126. Thus, when dispensing a dot of material, the piston 64 enters into the dispensing bore 104 at a relatively fast rate of speed and immediately decelerates upon the engagement of the shoulder portions 124, 126 of the piston 64. Resilient material 79 cushions this immediate deceleration of the piston 64.

In one embodiment, to change the size of dots dispensed by the dispenser unit 14, the barrel cylinder 62, piston 64 and orifice insert 90 may be replaced. Specifically, by unscrewing the needle nut 80, the orifice insert 90 and the orifice adapter 92, which are contained within the needle nut, are also removed. Once removed, the barrel cylinder 62 may be removed from its seat within the seal nut 74. The barrel cylinder 62 may be replaced with another barrel cylinder having a bore 72 of a different diameter. The piston 64 is replaced by another piston having a diameter sized so that the piston slides within the bore 72 of the barrel cylinder 62. Additionally, the orifice insert 90 may be replaced to have a small diameter bore 96 and a dispensing bore 104 that are sized to work with the specific barrel cylinder 62 and piston 64. As mentioned above, the entire nozzle assembly 34 may be replaced with a replacement nozzle assembly to change the size of the small diameter bore of the orifice insert.

Figure 3:
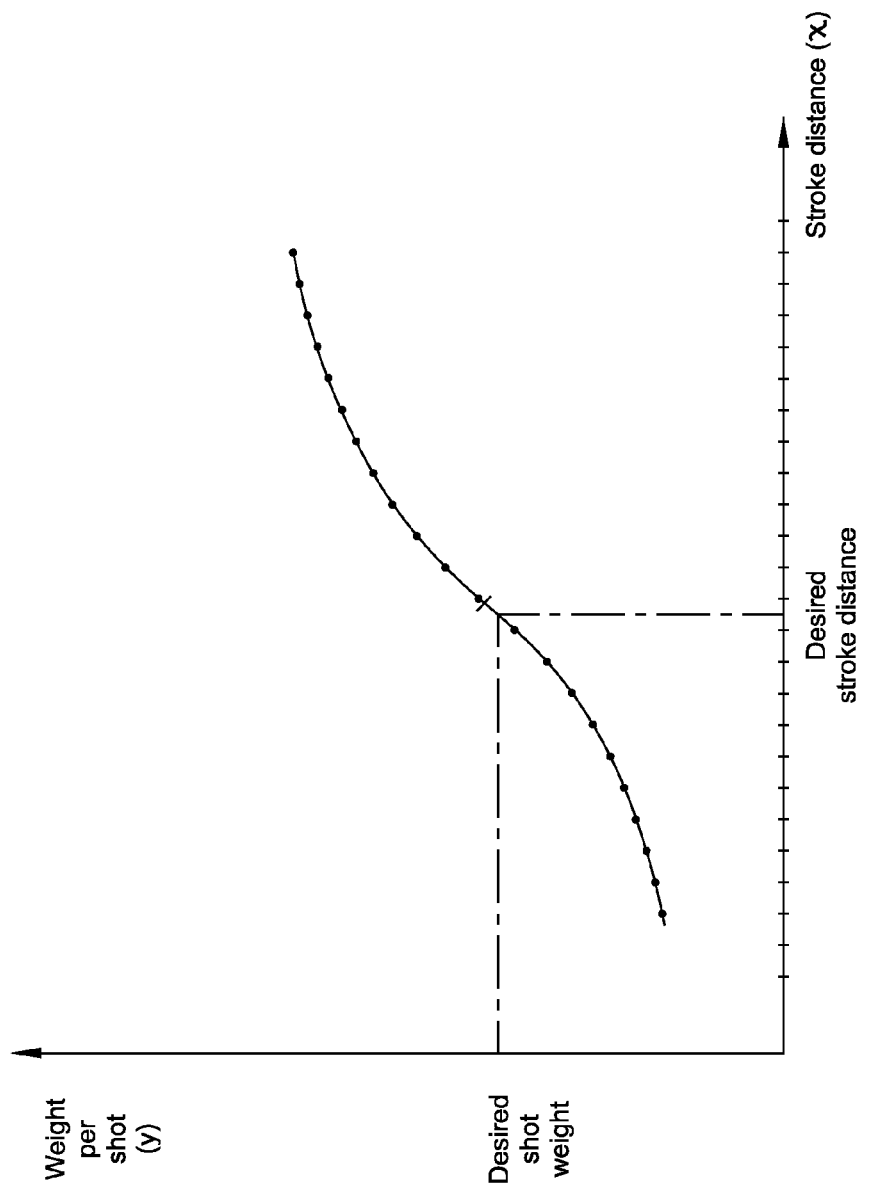
FIG. 3 is a graphical view of a function representing an output of the dispenser of FIG. 1 in accordance with another embodiment of the present disclosure.

FIG. 3 is a graphical view of a function representing an output (e.g., material dispensed) of one dispensing head 14 or 16 of the dispenser 10, shown on the y axis, with respect to the variable stroke distance A, shown on the x axis, such as described above with respect to FIG. 2. It should be understood that the graph of FIG. 3 is exemplary, and that the function may be determined by several independent factors, such as the composition of the viscous material and the configuration of the dispenser 10, in addition to the viscosity of the material. Further, the function may represent the output of either dispensing head 14 or 16, and it should be appreciated that separate functions may be derived for each respective dispensing head. As discussed above, the viscosity of the material may vary over time; however, for purposes of this example, the viscosity is presumed to be substantially constant. Variations in the viscosity of the material may change the function.

As described above with respect to FIG. 2, the dispenser 10 includes the piston for displacing the viscous material through the nozzle. The dispenser 10 dispenses varying quantities of viscous material as a function of the piston stroke distance A, shown on the x-axis of the graph in FIG. 3. The quantity of dispensed material is shown as a weight per shot on the y-axis. The volumetric flow rate of the dispenser 10 can be varied by altering the configuration of the dispensing chamber, the piston, and the nozzle, either individually or in combination. Further, the flow rate, and thus the amount of material that is dispensed per shot, can be affected by varying the piston displacement within the dispensing bore (e.g., the distance that the piston moves or strokes). For example, when dispensing material, the piston may move over one of a plurality of stroke distances. In one embodiment, the stroke distance may be represented by a charge value, which is the stroke distance measured in microns. The charge may range, in one example, from approximately 1500 to 2500 microns.

Since in some embodiments the amount of dispensed material is substantially equal to the volume of piston displacement, the quantity of material dispensed per shot typically increases as the stroke distance increases. However, it is appreciated that the output of the dispenser is not necessarily linear over the range of stroke distances, due in part to the hydraulic characteristics of the piston acting on the viscous material (e.g., the effects related to the size, shape, speed, and other characteristics of the dispenser). Further, the output of the dispenser is a function of a change in the viscosity of the material being dispensed, which may vary in response to changes in composition, temperature, humidity, or other factors.

According to one embodiment, the function illustrated in FIG. 3 may be derived through a calibration process, one example of which is described below with reference to FIG. 4. One calibration process includes weighing samples of material dispensed by one of the dispensing heads 14 and 16, each sample dispensed using one of a plurality of piston stroke distances A (as indicated in FIG. 2) in a particular configuration of the dispenser. For example, a series of samples may be dispensed and weighed for stroke distances A ranging from 1500 to 2500 microns, in increments of 100 microns (e.g., 1500, 1600, 1700, . . . , 2500). An output function can therefore be derived from this sample data that describes the expected output y of the dispenser in a given configuration for a given material having a given viscosity over a range of piston stroke distances x, such as represented by the curve in the graph of FIG. 3. Using the derived output function, a calibrated stroke distance which produces a desired quantity (or weight) of dispensed material may be determined with reasonable accuracy at least for the dispensing head 14 or 16 from which the samples were taken.

In at least one embodiment, it is appreciated that where two or more dispensing heads, each being substantially identical in configuration, are used to dispense the same or similar material, the output characteristics of one dispensing head relative to another may be substantially similar such that the output functions of each head are nearly identical. In some of these embodiments, any differences between the output functions of the multiple dispensing heads can be accounted for by applying an offset variable to the derived output function of one of the dispensing heads. For example, if the output of a first dispensing head is described by $y=f(x)$, the output of a second dispensing head can be described by $y=f(x)+\text{offset}$ with reasonable accuracy, provided that both the first and second heads are dispensing the same material having substantially the same viscosity. The offset can be used to quickly apply calibration adjustments to the dispensing system 10. For example, it is known that the viscosity of a material can change over the course of a few hours. Therefore it may be advantageous to recalibrate the dispensing system 10 at periodic intervals of operation to help ensure that the actual output is within desired tolerances. To expedite the recalibration process, the sampling procedure described above is performed on only one of the dispensing heads to calculate the derived output function for that head. The corresponding (and previously calculated) offset values are then applied to the output function for each of the other dispensing heads.

In another embodiment, if the output of a first dispensing head is described by $y=f(x)$, the output of a second dispensing head can be described by $y=\text{scalefactor}*f(x)+\text{offset}$. The scalefactor represents a scaling factor that may be used to account for situations where the second dispensing head has a different effective dispensing bore size than the first dispensing head. It should be understood that the offset and scalefactor are each optional variables, which may be used alone or in combination.

Figure 4:
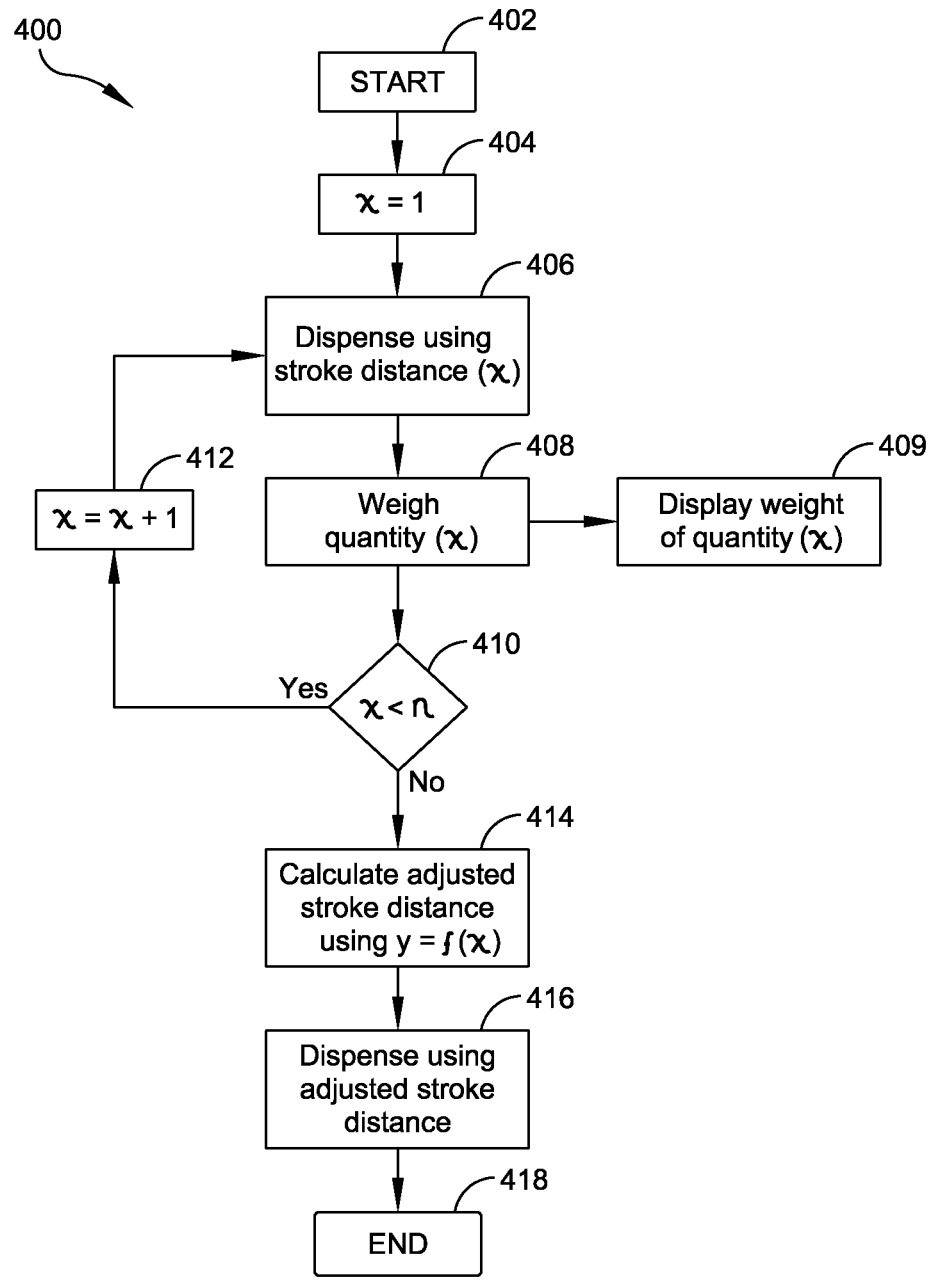
FIG. 4 is a flow diagram of a process for calibrating the dispenser of FIG. 1 in accordance with yet another embodiment of the present disclosure.
Figure 8:
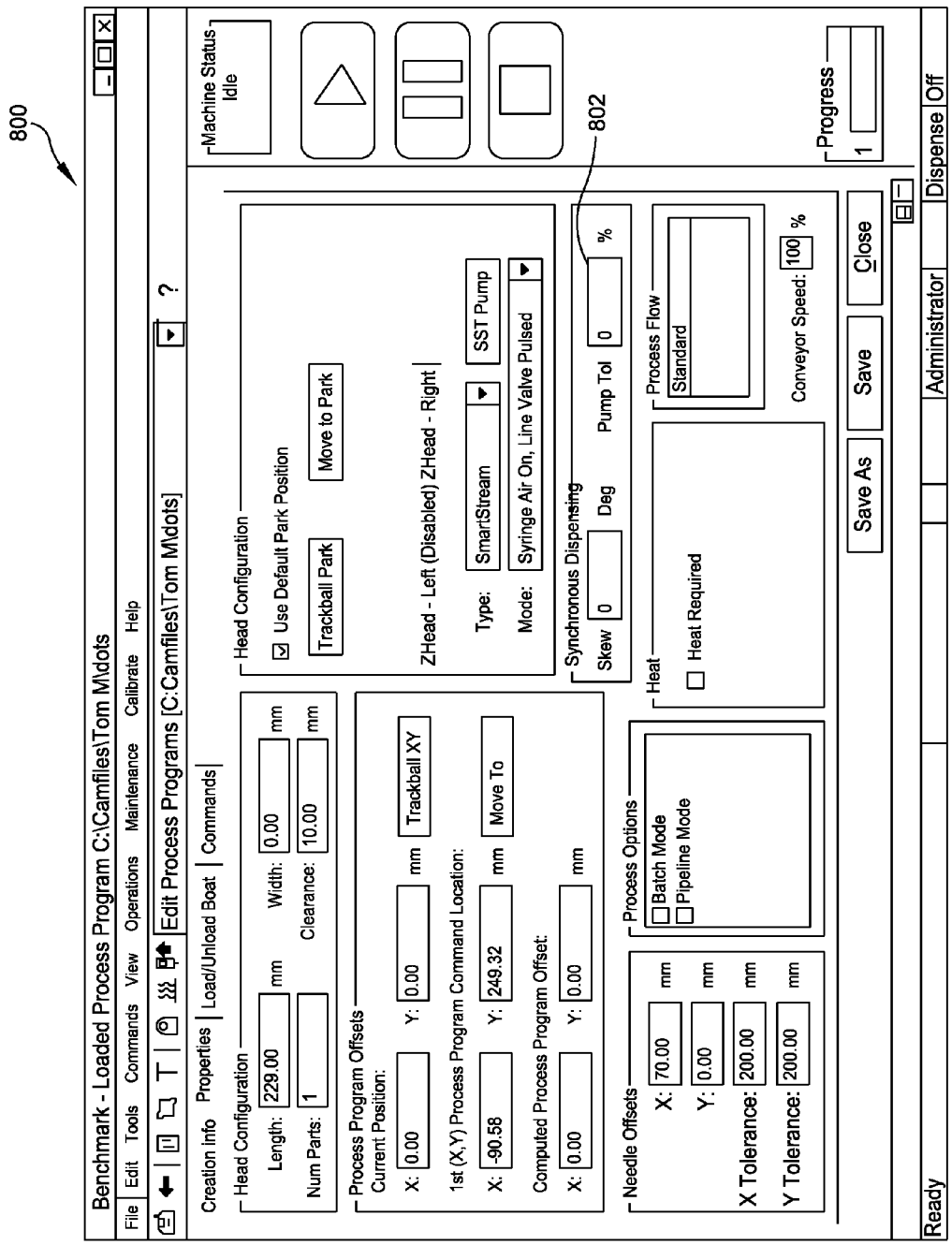
FIG. 8 is a screen shot showing a user interface in accordance with another embodiment of the present disclosure.

FIG. 4 is a flow chart of a process 400 for calibrating the dispenser 10 or a similarly operating dispenser, according to one embodiment. The process 400 begins at block 402. A portion of the process 400 is iterative over n steps. At block 404, a variable x is set to 1. At block 406, a sample of viscous material is dispensed by the dispenser 10 using one of a plurality of stroke distances, e.g., stroke distance(x). In one example, the plurality of stroke distances may include a set of charge values, such as {1500, 1600, 1700, . . . , 2500}. At block 408, the sample that results from dispensing using the stroke distance(x) is weighed. According to one embodiment, it is appreciated that single deposits (i.e., one shot of material) are small and difficult to weigh accurately. Therefore, the sample may include multiple deposits (e.g., 100 shots), providing a scaling factor that enables more accurate measurements of the samples. The weight of each sample is displayed to a user using a user interface device at block 409.

At block 410, variable x is evaluated to determine if x is less than n, the total number of iterations in this portion of the process 400. If x is less than n, then the process 400 proceeds to block 412, where x is incremented by one. The process then proceeds to block 406 again, where another sample of the material is dispensed using a different stroke distance(x).

If x is not less than n, then the process 400 proceeds to block 414. As discussed above, the desired amount of material dispensed by the dispenser 10 is a function of the stroke distance of the piston 64. Having now gathered several samples of material dispensed using various stroke distances, it is possible to derive a function that approximately describes the amount of material that will be dispensed at any stroke distance within the range used in the above-described steps. Such an equation may be represented as $y=f(x)$, where x represents the stroke distance that causes the dispenser 10 to dispense a quantity y of material. Accordingly, at block 414, the function $f(x)$ may be used to calculate an adjusted stroke distance x that will cause the dispenser to dispense a desired quantity y of material. At block 416, the dispenser 10 dispenses the desired quantity of material using the adjusted stroke distance. The process 400 ends at block 418. It should be appreciated that the process 400 may be used for calibrating each dispensing head of any dispenser having multiple heads.

One exemplary configuration procedure of the dispenser 10 will now be described according to various embodiments of the present disclosure. In one embodiment, the configuration procedure enables a user to configure the dispenser 10 to dispense a specific amount of material per shot, and further to enable the dispenser to measure and/or apply corrections, if necessary, such that the output of the dispenser remains substantially the same over a period of time (e.g., one day of operation) to account for any changes in the viscosity (or other property) of the material. In another embodiment, the configuration procedure enables the user to calibrate a dispenser 10 having two dispensing heads 14, 16 to ensure that the output of both heads is substantially the same.

An exemplary configuration procedure that utilizes the process 400, discussed above, will now be described. Generally, the process 400 enables the user to enter a range of charge values and steps, along with other dispensing parameters. When executed, the process 400 will cause the dispenser 10 to dispense material at each charge with the range of charge values, in steps as specified by the user, and generate a list of weights per shot at each charge. When the configuration procedure is complete, the controller 18 may use the data collected (e.g., the weights per charge) to make any adjustments during operation so as to maintain the desired output.

Initially, a user may select a dispenser configuration that will enable the dispenser to output a desired volume of viscous material. For example, the user may choose to fit the dispenser with a 0.20 mm or a 0.32 mm dispensing chamber. The user may also choose a dispensing nozzle that is appropriate for the desired application. Next, the user may initialize the dispenser by adjusting the charge (also referred to herein as the stroke distance) of the dispenser head and testing the output until the desired output is achieved. For example, if the user desires a per shot weight of 0.2 mg of viscous material, the user may command the dispenser to dispense a sample of material with a particular charge. The sample is then weighed. The sample may include a single shot of material, or multiple shots (e.g., 100 shots), the latter of which may be easier to weigh for small per shot amounts. If the sample is too light or too heavy (i.e., the amount of deposited material is less or more than the desired amount), the charge is adjusted up or down accordingly, and an additional sample is dispensed and weighed. The user may repeat this procedure until the per shot output weighs approximately 0.2 mg. At this point, the charge value may be recorded (e.g., 2000 microns) and set in the dispenser controller. Thereafter, the dispenser will operate with a charge of 2000 for producing 0.2 mg per shot deposits of the material. Of course, the charge will vary according to a change in the viscosity of the material, in addition to other factors including, but not limited to, the configuration of the dispenser.

In one embodiment, a Pump Characterization user interface, such as the user interface 600 shown in FIG. 6, may be used to perform the above described initialization procedure. After the dispenser is initialized, the user may configure the dispenser to perform the calibration process 400, as described above with respect to FIG. 4, or a similar calibration process. Such configuration may be performed using the Pump Characterization user interface 600. The user interface 600 permits the user to configure the target dot size 602, and the minimum and maximum charge values 604 and 606, respectively, to be used during the calibration process. Further, the user interface 600 includes a field for entering the charge step value 608. For example, the calibration process may begin by dispensing shots at the minimum charge (e.g., 1500), weigh the dispensed sample, and repeat these steps for each charge value between the minimum and the maximum (e.g., 2500) in increments of 100. The characterization results, including the weight of each sample are displayed as generally indicated at 610. The pump characterization user interface 600 enables the user to view the weights of each sample for each dispensing head (e.g., where there is more than one dispensing head, the display will be adjusted to show the weights dispensed by each head), as generally indicated at 610.

After the characterization process has run, the user may select the Calculate button to calculate the correct charge value for the dispenser for a user-supplied target shot size 614. The calculation is based on the characterization results 610. If there are two dispensing heads, then the user interface 600 may include two charge values, indicated at 616 and 618. The calculated charge value(s) may be automatically used when the process program is subsequently executed. In one embodiment, an Apply Button may be used to automatically apply the calculated charge value(s) to the process program.

FIG. 5 illustrates, according to one embodiment, a user interface 500 having a Weigh Template that may be inserted into a process program. The Weigh Template will execute when the process program is executed to dispense the desired amount of material and weigh the dispensed material in the weigh scale 26. The user interface 500 includes fields that enable the user to enter the desired weight of the sample 502, a tolerance 504, and a number of samples 506. Optionally, the user may configure the dispenser to dispense the target weight 502 as either a per shot weight (e.g., the target weight is the weight of a single shot) or a total weight (e.g., the target weight is the weight of multiple shots) by selecting one of the radio buttons 508 and 510, respectively. A process program may be, for example, a series of computer-executed instructions that cause the dispenser 14, 16 to dispense a desired quantity of material in a pre-defined pattern on the substrate 12. The Weigh Template may be executed as part of the process program, for example, prior to dispensing material onto the substrate 12, to ensure that the dispenser 14 is properly configured. If the measured weight is out of tolerance then the process program uses the data generated during the pump characterization process, such as shown in FIG. 6, to change the charge value and therefore change the target weight.

According to various embodiments, it is appreciated that in situations where multiple dispensers are performing similar dispensing operations (e.g., in a shop having multiple dispensing machines running at the same time to produce the same parts), the above described characterization process is desirable for ensuring that a consistent volume of material is dispensed for all parts from all of the dispensing machines. In some embodiments, two or more dispensing machines may be networked together such that all such networked machines can be configured from a single point.

In another embodiment, the calibration of a second dispensing head may be accomplished such that the output of the second head matches the output of the first dispensing head. See, for example, a user interface 700 shown in FIG. 7. User interface 700 includes fields for setting and/or displaying the charge value for each dispensing head, indicated generally at 710. User interface 700 enables a correction factor to be applied based on the output from the calibration of the two heads. The system applies an offset to synchronize the output of a slave pump to the same output as a master pump. When applied to the charge value of the first (master) head, the offset causes the second head to output the same or substantially the same amount of material as the first head. For example, if the charge value is 2000 and the correction factor, or tolerance, is +1 or 1%, the first dispensing head will operate with a charge of 2000 and the second dispensing head (slave) will operate with a charge that is 1% greater. In another example, the correction factor may be a ratio of the output of the first dispensing head to the second dispensing head.

In one embodiment, two dispensing heads may be calibrated in sequence or at the same time. Each dispensing head dispenses a sample of material, both of which are then weighed. If the difference between the weights of each sample is outside of an error range, the user may be notified of the error. For example, the error range may be established as a percentage error or tolerance by the user using a tolerance configuration user interface 800 having a tolerance entry field 802.

Various aspects and functions in accordance with the present disclosure, including the user interfaces 500, 600, 700, and 800 shown in FIGS. 5-8, may be implemented as specialized hardware or software executing in one or more special purpose or general purpose computer systems. Such computer systems may include a processor that performs a series of instructions that result in manipulated data. The processor may be a commercially available processor such as an Intel Pentium, Motorola PowerPC, SGI MIPS, Sun UltraSPARC, or Hewlett-Packard PARISC processor, but may be any type of processor or controller as many other processors and controllers are available. The computer system may include specially-programmed, special-purpose hardware, for example, an application-specific integrated circuit (ASIC) tailored to perform a particular operation disclosed herein. Other embodiments may perform the same function using a general purpose computing device.

The computer system may include an operating system that manages at least a portion of the hardware elements included in the computer system. Usually, a processor or controller executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating system available from various sources. Many other operating systems may be used, and the embodiments disclosed herein are not intended to be limited to any particular implementation.

The processor and operating system together define a computer platform for which application programs in high level programming languages may be written. These component applications may be executable, intermediate, for example, C−, bytecode or interpreted code which communicates over a communication network, for example, the Internet, using a communication protocol, for example, TCP/IP. Similarly, aspects in accord with the present disclosure may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accordance with the present disclosure may be implemented in a non-programmed environment, for example, documents created in HTML, XML or other format that, when viewed in a window of a browser program, render aspects of a graphical-user interface or perform other functions. Further, various embodiments in accord with the present disclosure may be implemented as programmed or non-programmed elements, or any combination thereof. For example, a web page may be implemented using HTML while a data object called from within the web page may be written in C++. Thus, the disclosure is not limited to a specific programming language and any suitable programming language could also be used.

According to one embodiment,

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of calibrating a dispenser of the type having an actuator that is movable over a variable stroke distance, the method comprising acts of:
dispensing a quantity of viscous material from the dispenser by moving the actuator over one of a plurality of stroke distances;
weighing the quantity of viscous material;
repeating the acts of dispensing and weighing for each of the plurality of stroke distances;
displaying the weight of each of the dispensed quantities to a user using a user interface device;
dispensing a desired quantity of viscous material by adjusting the stroke distance of the actuator according to a function that relates the weight of each of the dispensed quantities to a respective one of the plurality of stroke distances, such that the desired quantity of viscous material substantially has a desired weight,
wherein the actuator is a first actuator, wherein the quantity of viscous material is a first quantity of viscous material, wherein the dispenser further includes a second actuator that is movable over the variable stroke distance for dispensing a second quantity of viscous material, and wherein the method further comprises acts of:
dispensing the second quantity of viscous material from the dispenser by moving the second actuator over one of the plurality of stroke distances;
weighing the second quantity of viscous material;
repeating the acts of dispensing the second quantity and weighing the second quantity for each of the plurality of stroke distances; and
displaying the weight of each of the dispensed second quantities to the user using the user interface device,
wherein the function is a first function, wherein the desired quantity is a first desired quantity, and wherein the method further comprises an act of dispensing a second desired quantity of viscous material by adjusting the stroke distance of the second actuator according to a second function that relates the weight of each of the dispensed second quantities to a respective one of the plurality of stroke distances, such that the second desired quantity of viscous material substantially has the desired weight; and
determining a stroke distance offset based on a difference between the adjusted stroke distance of the first actuator and the adjusted stroke distance of the second actuator.

2. The method of claim 1, wherein the quantity of viscous material that is dispensed from the dispenser is substantially equal to the volume of viscous material displaced by the actuator moving over a respective one of the plurality of stroke distances.

3. The method of claim 1, wherein the user interface device includes a display coupled to a dispenser controller.

4. The method of claim 1, wherein the adjusted stroke distance of the second actuator is the adjusted stroke distance of the first actuator modified by the stroke distance offset.

5. A controller coupled to a dispenser of the type having an actuator that is movable over a variable stroke distance, the controller comprising:
  a calibration component configured to perform acts of:
    dispensing a quantity of viscous material from the dispenser by moving the actuator over one of a plurality of stroke distances;
    weighing the quantity of viscous material;
    repeating the acts of dispensing and weighing for each of the plurality of stroke distances; and
    displaying the weight of each of the dispensed quantities to a user using a user interface device coupled to the controller;
  wherein the controller further comprises a dispensing component configured to perform an act of dispensing a desired quantity of viscous material by adjusting the stroke distance of the actuator according to a function that relates the weight of each of the dispensed quantities to a respective one of the plurality of stroke distances, such that the desired quantity of viscous material substantially has a desired weight;
  wherein the actuator is a first actuator, wherein the quantity of viscous material is a first quantity of viscous material, wherein the dispenser further includes a second actuator that is movable over the variable stroke distance for dispensing a second quantity of viscous material, and wherein the dispensing component is further configured to perform acts of:
    dispensing the second quantity of viscous material from the dispenser by moving the second actuator over one of the plurality of stroke distances;
    weighing the second quantity of viscous material;
    repeating the acts of dispensing the second quantity and weighing the second quantity for each of the plurality of stroke distances; and
    displaying the weight of each of the dispensed second quantities to the user using the user interface device;
  wherein the function is a first function, wherein the desired quantity is a first desired quantity, and wherein the dispensing component is further configured to perform an act of
    dispensing a second desired quantity of viscous material by adjusting the stroke distance of the second actuator according to a second function that relates the weight of each of the dispensed second quantities to a respective one of the plurality of stroke distances, such that the second desired quantity of viscous material substantially has the desired weight; and
  wherein the dispensing component is further configured to perform an act of determining a stroke distance offset based on a difference between the adjusted stroke distance of the first actuator and the adjusted stroke distance of the second actuator.

6. The controller of claim 5, wherein the quantity of viscous material that is dispensed from the dispenser is substantially equal to the volume of viscous material displaced by the actuator moving over a respective one of the plurality of stroke distances.

7. The controller of claim 5, wherein the user interface device includes a display.

8. The controller of claim 5, wherein the adjusted stroke distance of the second actuator is the adjusted stroke distance of the first actuator modified by the stroke distance offset.

* * * * *